United States Patent [19]

Takayama et al.

[11] Patent Number: 5,303,415
[45] Date of Patent: Apr. 12, 1994

[54] PULSE NOISE DETECTING CIRCUIT OF AM RECEIVER

[75] Inventors: Kazuo Takayama; Hirokazu Matsunaga, both of Kobe, Japan

[73] Assignee: Fujitsu Ten Limited, Hyoga, Japan

[21] Appl. No.: 938,147

[22] PCT Filed: Feb. 27, 1992

[86] PCT No.: PCT/JP92/00213

§ 371 Date: Oct. 23, 1992

§ 102(e) Date: Oct. 23, 1992

[30] Foreign Application Priority Data

Feb. 27, 1991 [JP] Japan ................. 3-32635
Feb. 27, 1991 [JP] Japan ................. 3-32639

[51] Int. Cl.⁵ .............................. H04B 1/10
[52] U.S. Cl. ...................... 455/296; 455/234.1
[58] Field of Search ........... 455/295, 296, 297, 226.1, 455/226.3, 303, 308, 309, 312, 311, 307, 254, 234.1, 232.1; 375/99, 104, 102, 58, 34

[56] References Cited

U.S. PATENT DOCUMENTS

| | | | |
|---|---|---|---|
| 3,241,073 | 3/1966 | Hummel | 455/296 |
| 4,637,066 | 1/1987 | Kennedy et al. | 455/303 |
| 4,701,715 | 10/1987 | Amazawa et al. | 455/312 |
| 4,856,084 | 8/1989 | Richards, Jr. | 455/311 |
| 4,899,389 | 2/1990 | Amazawa | 455/297 |
| 4,910,799 | 3/1990 | Takayama | 455/296 |
| 4,965,854 | 10/1990 | Glazebrook | 455/295 |
| 5,140,704 | 8/1992 | Ueno | 455/296 |

FOREIGN PATENT DOCUMENTS

| | | | |
|---|---|---|---|
| 0477460 | 4/1992 | European Pat. Off. | 455/296 |
| 41-7542 | 4/1966 | Japan . | |
| 53-64410 | 6/1978 | Japan . | |
| 55-46087 | 11/1980 | Japan . | |
| 57-35425 | 2/1982 | Japan . | |
| 0259031 | 12/1985 | Japan | 455/296 |
| 61-200722 | 9/1986 | Japan . | |
| 0225229 | 9/1989 | Japan | 455/296 |

Primary Examiner—Reinhard J. Eisenzopf
Assistant Examiner—Nguyen Vo
Attorney, Agent, or Firm—Oliff & Berridge

[57] ABSTRACT

The present invention is intended to detect pulse noise entering an AM receiver in order to improve the freedom in construction and prevent erroneous operation. It provides a pulse noise detecting circuit in an AM receiver having an envelope detecting portion (108) that performs envelope detection on an intermediate frequency signal and outputs a gate signal for removing a pulse noise signal mixed in an output signal of the envelope detecting portion including a high pass filter (31) that blocks the envelope detection signal from the envelope detecting portion (108) and extracts the pulse noise signal, an amplifier (32) that amplifies the extracted pulse noise, a level detecting portion (33) that detects the level of the amplified pulse noise signal and outputs the gate signal when the level is a predetermined value, and a second band filter (34) that extracts the envelope detection signal and adjusts the smoothed amplification to make the level of the pulse noise signal constant.

7 Claims, 11 Drawing Sheets

PULSE NOISE DETECTING CIRCUIT OF AM RECEIVER

TECHNICAL FIELD

The present invention relates to a pulse noise detecting circuit provided in an AM receiver for detecting pulse noise signal entering the AM receiver.

More particularly, the present invention alludes to improvement of the pulse noise detecting circuit of the AM receiver to allow greater freedom in construction of the AM receiver and to prevent erroneous operation.

BACKGROUND ART

Figure 18:
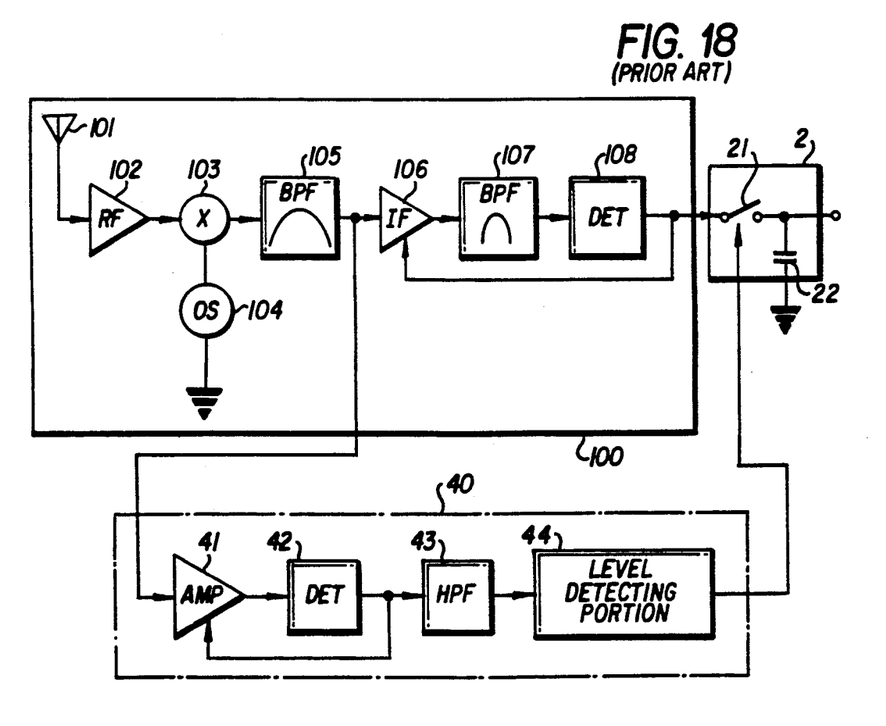
FIG. 18 is a diagram showing a prior art pulse noise detecting circuit of an AM receiver.

FIG. 18 is a diagram showing a prior art pulse noise detecting circuit in an AM receiver Note, the same reference numerals and symbols are used to represent the same elements throughout all of the drawings. The construction of the figure includes a tuner 100 of the AM receiver, a pulse noise removal portion 2 for removing pulse noise from an output signal of the tuner 100, and a pulse noise detecting portion 40 for detecting the pulse noise to output a gate signal for removing the pulse noise to the pulse noise removal portion 2.

The tuner 100 includes an antenna 101, a RF amplifier 102 connected to the antenna 101, a mixer 103 connected to the RF amplifier 102, a local oscillator 104 supplying a mixing signal to the mixer 103, a broad band filter 105 connected to the mixer 103, an intermediate frequency amplifier 106 connected to the broad band filter 105, a narrow band filter 107 connected to the intermediate frequency amplifier 106, and, for example, an envelope detector 108 connected to the broad band filter 107. Automatic gain control is performed using the output of the detector 108 to the amplification gain of the intermediate frequency amplifier 106. The output of the detector 108 is made constant.

The pulse noise removal portion 2 includes a gate circuit 21 and a holding capacitor 22.

FIG. 19 is a view illustrating the removal of noise using the pulse noise removal portion of FIG. 18.

As shown in (a) of the figure, in a signal input to the pulse removal portion 2, pulse noise is superposed on a detection signal. This pulse noise is, for example, ignition noise, noise mixed from a transmission line, etc. in a receiver installed in a vehicle. Also, as shown in (b) of the figure, there is a gate signal detected by the pulse noise detecting portion 40 and synchronized with the pulse noise. Further, as shown in (c) of the figure, when the gate signal allows the gate circuit 21 to be open and the pulse noise to be removed, the level of the detection signal before removal of a pulse noise signal is held by the capacitor 22. When the gate circuit 21 is closed, the holding of the detection signal is released As shown in (d) of the figure, the post removal waveform shown in (c) of the figure is corrected by another apparatus not shown.

The pulse noise detecting potrion 40 of FIG. 18 includes an amplifier 41 connected to the output of the broad band filter 105, an envelope detector 42, for example, connected to the amplifier 41, a high pass filter 43 connected to the detector 42, and a level detecting portion 44 connected to the high pass filter 43 and producing a gate signal for operating the gate circuit 21.

The reason why the tuner 100 is provided with the broad band filter 105 is to obtain a greater amplitude of noise in the pulse noise detection portion 40 so as to make the detection of the pulse noise easier.

Also, in order to make the output of the detector 42 constant, automatic gain control is performed to control the amplification gain of the amplifier 41.

Next, the operation will be discussed. A received signal with pulse noise mixed is branched by the band filter 105, passes through the amplifier 41, has the carrier wave removed by the envelope detector 42 to become a demodulation wave, has all but the pulse noise high frequency removed by the high pass filter 43, is shaped into the gate signal by the level detecting portion 44 and is then output to the gate circuit 21.

However, since the prior art pulse noise detecting circuit of the AM receiver is required to amplify the branched signal in the band filter 105 and further perform detection etc., there were the problem of emission of a higher harmonic wave components of 910 KHz caused by detection distortion of an intermediate frequency 455 KHz after the mixer 103 and issuing of a beat ("tweet"), the problem of a need for special consideration in the layout of parts for preventing the higher harmonic wave from being mixed, and the problem of a low freedom of design owing to the limitations in construction of the band filter 105.

Therefore, the present invention, in consideration of the above problems, provides a pulse noise detecting circuit of an AM receiver in which the freedom in design is higher and malfunctions are improved.

Also, in the prior art pulse noise detecting circuit of the AM receiver, the next problem arises.

Figure 20:
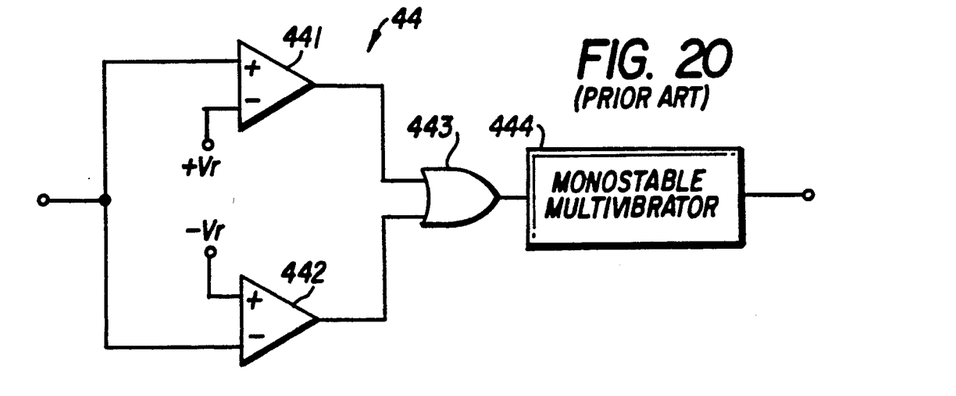
FIG. 20 is a view showing a construction of a level detecting portion of FIG. 18.

FIG. 20 is a view showing the construction of the level detecting portion of FIG. 18. The figure includes a comparator 441 whose non-inversion terminal inputs the output signal of the high pass filter 43 and whose inversion terminal inputs a referrence voltage $+V_r$ a comparator 442 whose inversion terminal inputs the output signal of a high pass filter 43 and whose non-inversion terminal inputs a reference voltage $-V_r$, an OR circuit 443 connected to the comparator 441 and 442, and a monostable multivibrator 444 connected to the OR circuit 443 and outputting the gate signal to the pulse noise removal portion 2.

Next the operation of the level detecting portion 44 will be discussed.

FIG. 21 is a view illustrating the signal waveform at the level detecting portion 44 of FIG. 20. (a) of the figure shows a waveform of the signal output from the detector 42, and (b) of the figure shows a waveform of a signal from the high pass filter 43 extracting high frequency noise components from the signal of the detector 42, which differs from the original waveform of the output signal of the detector 42. (c) of the figure shows the output signal of the comparators 441 and 442. It is a positive rectangular pulse produced at more than $+V_r$ when the signal is positive and less than $-V_r$ when negative. (d) shows a waveform of the output signal produced by the monostable multivibrator from the comparators 441 and 442 through the OR circuit 443.

Figure 19A:
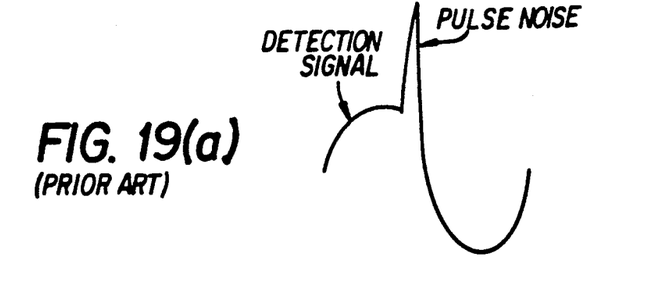
FIG. 19 is a view explaining the removal of noise using the pulse noise removal portion shown in FIG. 18.
Figure 19B:
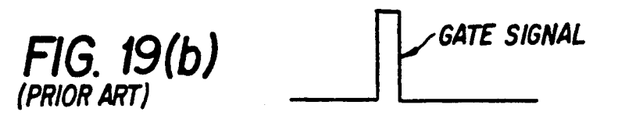
Figure 19C:
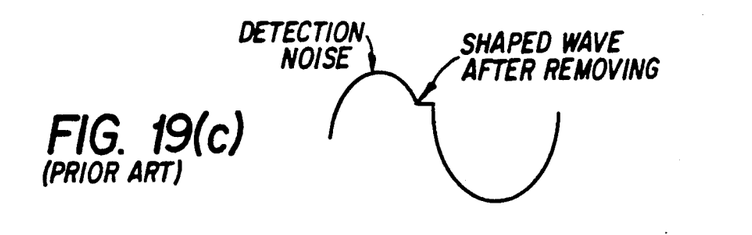
Figure 19D:
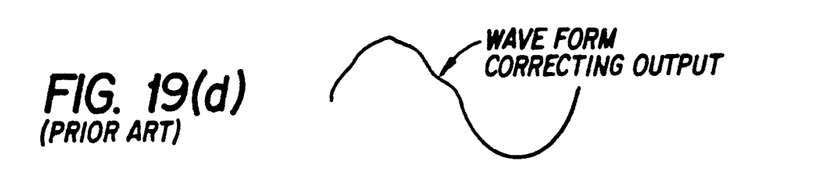
Figure 21A:
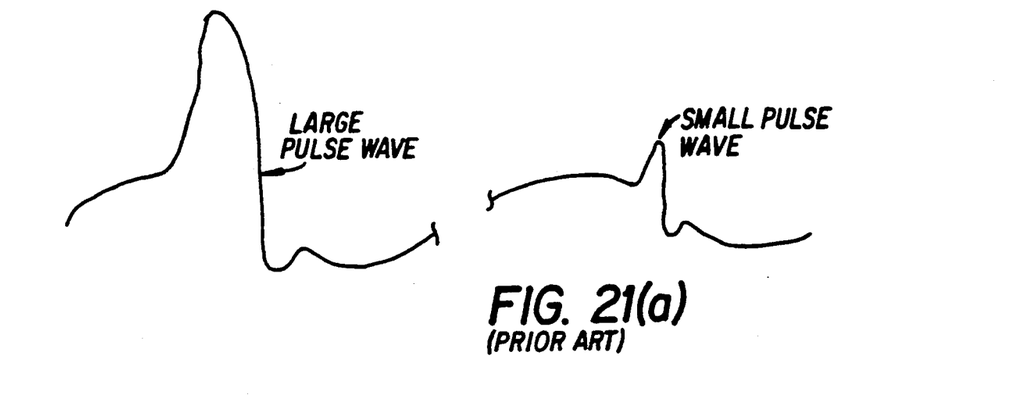
FIG. 21 is a view showing a signal waveform of a level detecting portion of FIG. 20.
Figure 21B:
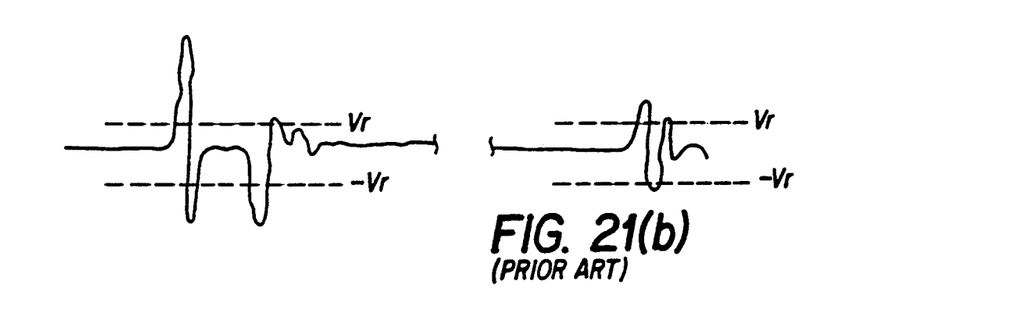
Figure 21C:
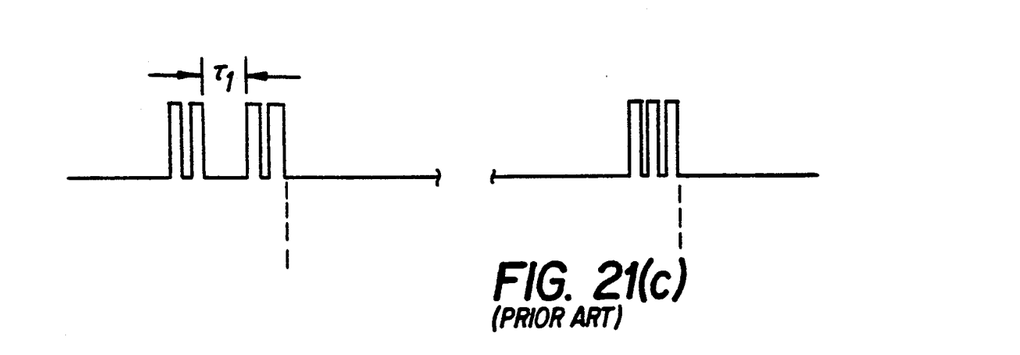
Figure 21D:
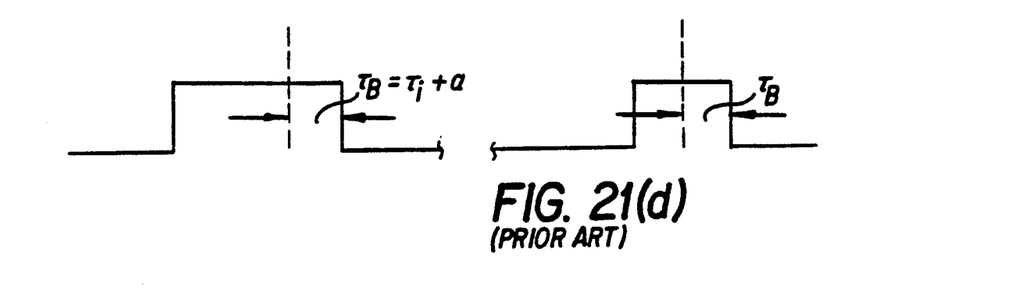

(a) of the figure shows when the pulse noises is large and small. The wave width of the pulse noise, however, increases as the wave height thereof increases. Further it is determined fundamentally according to an impulse response of an intermediate frequency filter of the tuner 100. Various kinds of distortion are caused and the wave width spreads if the pulse noise added becomes large. The places causing the distortion are the intermediate frequency amplifier 106, the amplifier 41, the detectors 108 and 42 etc. Therefore, when the positive and negative side pulses are detected and the pulse width of the gate is made by the monostable multivibrator 444, since the pulse width changes depending on the pulse height, usually, as illustrated, it is optimized to the higher value of the pulse height. Thus said $\tau_B$ is made $\tau_1 + \alpha$. Here, $\tau_1$ is a time interval between the positive and negative sides and $\alpha$ is a design margin. In this case, even if there is no longer any pulse noise, the gate is open during $\tau_B = \tau_1 + \alpha$. A problem arises in that in the case of a small wave height of the pulse noise the gate width is too broad and an excess of wave distortion occurs as shown in FIG. 19(c). Further, the provision of two comparators which is required to detect the positive side pulse and the negative side pulse introduces an obstacle for simple construction.

Further the present invention, in view of the above problem, has as its object to provide a pulse noise detecting circuit of an AM receiver varying the gate width according to the wave height of the input pulse.

DISCLOSURE OF INVENTION

A pulse noise detecting circuit of an AM receiver that has an envelope detecting portion performing envelope detection of an intermediate frequency signal passing through a first band filter and a pulse noise removal portion that removes a pulse noise signal mixed in an output signal of the envelope detecting portion, includes a pulse noise detecting portion for detecting the pulse noise to output to the pulse noise removal portion a gate signal for removing the pulse noise, characterized in that it comprises a high pass filter that obstructs an envelope detection signal from the envelope detecting portion and extracts the pulse noise, an amplifier that amplifies the pulse noise extracted by the high pass filter, and a level detecting portion that detects the level of the pulse noise amplified by the amplifier and outputs the gate signal to said pulse noise removal portion when the level attains a predetermined value, there is, a second band filter that extracts the envelope detection signal of the envelope detecting portion, the gain of the amplifier is adjusted by the detected and smoothed level of the envelope detection signal extracted by the second band filter, and the level of the pulse noise is made constant.

With the above pulse noise detecting circuit of the AM receiver Of the present invention, when the pulse noise is input to the envelope detecting portion, the asymmetry of the pulse noise causes a higher harmonic wave to occur. The higher harmonic wave is extracted by the high pass filter and detected, the signal is amplified, the signal level is detected, and a gate signal operating the pulse noise removal portion is produced. This gate signal is adjusted so that the envelope detection signal of the envelope detecting portion is extracted, the gain of the amplifier is adjusted by a detected and smoothed level of the extracted envelope detection signal, and the level of the pulse noise becomes constant. Accordingly, it is no longer necessary to include a detecting portion inside as in the past and it is no longer necessary to consider the effect of detection distortion.

Further, dealing with the adjacent interference, the asymmetry of the band filter at the intermediate frequency stage of the tuner is considered, so that the malfunctions due to the saime are prevented and reliability improved.

Also, the signal delay circuit may be used to adjust the timing of the pulse noise detecting circuit and the tuner to be adjusted and synchronizes the pulse noise removal portion.

Also, the level detecting portion includes a positive or negative discriminating portion that discriminates a positive or negative output signal of the high pass filter, holding and reducing portion that hold the outputs of the high pass filter discriminated by the positive or negative discriminating poriton and reduce the output with a certain time constant, a subtracting portion that obtains the difference of the outputs of the holding and reducing portion and a comparing portion that outputs the gate signal to the pulse noise removal portion when the output signal of the subtracting portion exceeds a predetermined value.

With the above level detecting portion, the signal input to the pulse noise detection circuit passes through the high pass filter to become a high frequency component, and is devided into a positive or negative signal by the positive or negative discriminating portion. The peak of the input signal is held temporarily and reduced in a predetemined time by the holding and reducing portion. The difference of the signals processed in this way is taken in the subtracting portion, so that one pulse is shaped with the leading edge and trailing edge of the pulse noise and it takes a longer time to reduce if the height of the pulse noise is higher. In a comparator, the gate signal is generated in the time after the above processed signal become more than a predetermined reference voltage until it falls to less than that, so the gate width is broader as the height of the pulse noise is larger, and the gate width is narrower as the height of the pulse noise is smaller. Further, in the prior art, two comparators were required, so compared with this, the construction is simpller because a single comparator is sufficient.

BRIEF DESCRIPTION OF THE DRAWINGS

The invention will be described below with reference to accompanying drawings in which.

DESCRIPTION OF THE PREFERRED EMBODIMENTS

Figure 1:
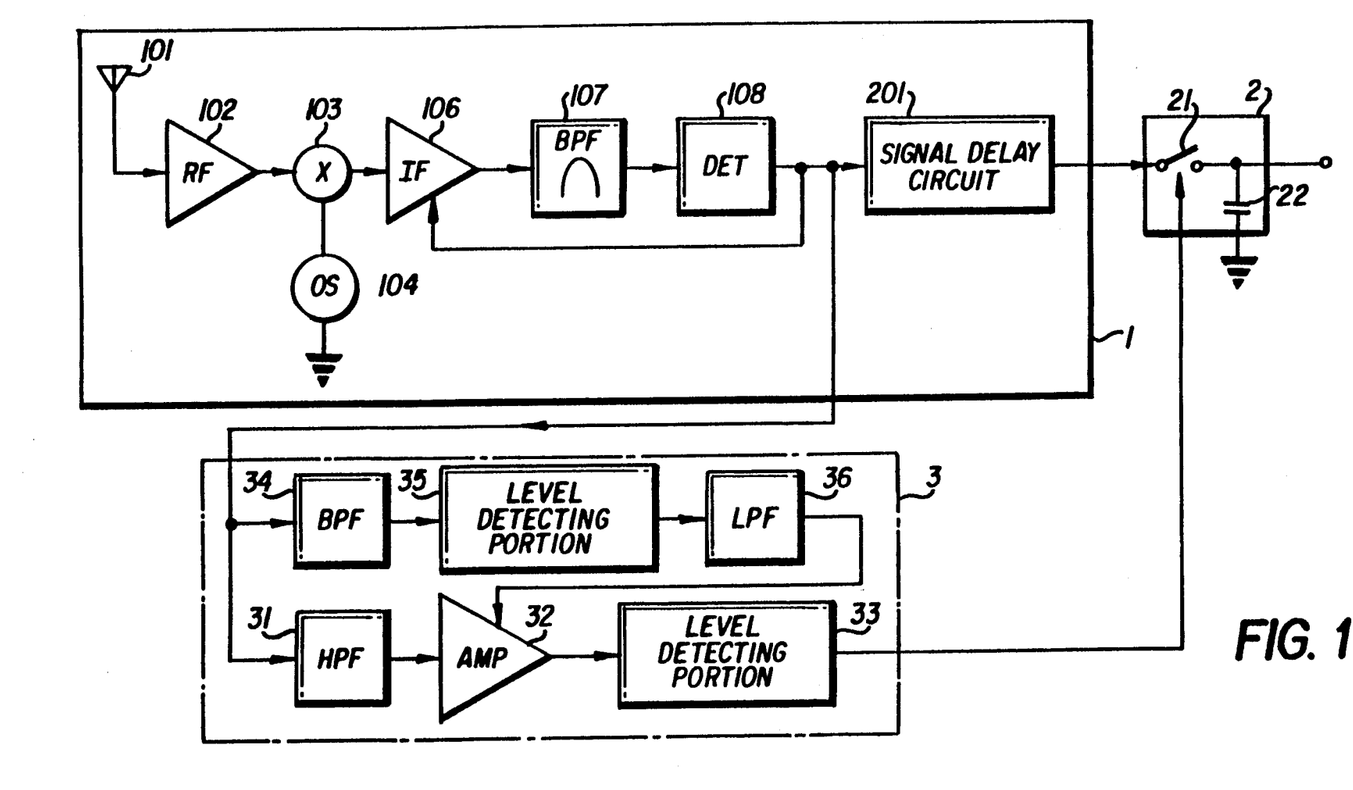
FIG. 1 is a diagram showing a pulse noise detecting circuit of an AM receiver according to a first embodiment of the present invention.

FIG. 1 is a diagram showing a pulse noise detecting circuit of an AM receiver according to an embodiment of the present invention. The construction of the figure will be discussed.

The pulse noise detecting circuit 3 of an AM receiver of the figure comprises a high pass filter 31 connected to the output of the envelope detecting portion 108 of the tuner 1, an amplifier 32 connected to the high pass filter 31, a level detecting portion 33 connected to the amplifier 32 and connected to the gate circuit 21 of the pulse noise removal portion 2, a band filter 34 connected to the output of the envelope detecting portion 108, a level detecting portion 35 connected to the band filter 34, and a low pass filter 36 connected to the level detecting portion 35 to control an amplification gain of the amplifier 32.

The tuner 1, comparing with FIG. 18, has the band filter 105 removed, uses the envelope detecting portion 108, assuming an envelope detection wave, as a detector, and newly includes a signal delay circuit 201 between the envelope detecting portion 108 and the pulse noise removal portion 2, in order to synchronize with the pulse noise detecting circuit 3.

Figure 2:
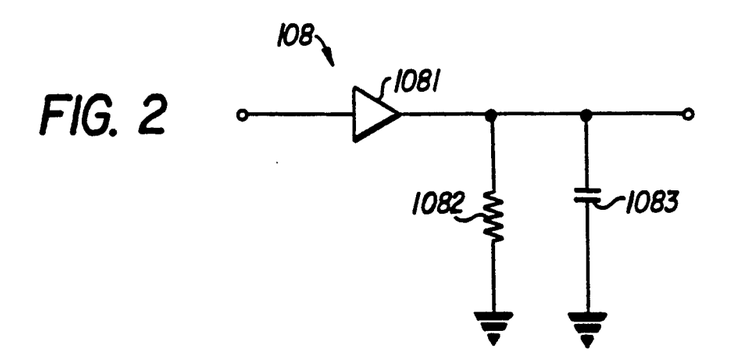
FIG. 2 is a view showing the construction of an envelope detecting portion of FIG. 1.

Next, the envelope detecting portion 108 will be discussed.

FIG. 2 is a view showing a construction of the envelope detecting portion of FIG. 1. The figure includes a diode 1081 which receives input at its anode and gives an output signal from its cathode and a resistor 1082 and a capacitor 1083, ones of which is connected to the cathode of the diode 1081 and the other of which is grounded.

Next, the operation of the envelope detecting portion 108 will be discussed. Assuming a modulation signal has a frequency band width, the modulation signal $V_m(t)$ is indicated by $$V_m(t) = \sum_{n=1}^{\infty} A_n \cos(npt + \phi_n) \quad (1)$$

and an amplitude modulated wave $V_{AM}(t)$ is indicated by $$V_{AM}(t) = A\left(1 + \sum_{n=1}^{\infty} A_n \cos(npt + \phi_n)\right)\cos(\omega t + \phi_o) \quad (2)$$

$$= A\cos(\omega t + \phi_o) + \quad \text{(carrier wave)}$$

$$\tfrac{1}{2}A \sum_{n=1}^{\infty} A_n \cos\{(\omega + np)t + \phi_n + \phi_o\} + \quad \text{(upper side wave)}$$

$$\tfrac{1}{2}A \sum_{n=1}^{\infty} A_n \cos\{(\omega - np)t + \phi_n - \phi_o\} \quad \text{(lower side wave)}$$

where
$A_n$: amplitude of modulated signal,
p: angular frequency of modulated signal,
$\phi_n$: initial phase of modulated signal,
A: amplitude of carrier wave,
$\omega$: angular frequency of carrier wave,
$\phi_O$: initial phase of carrier wave.

Figures 3, 4:
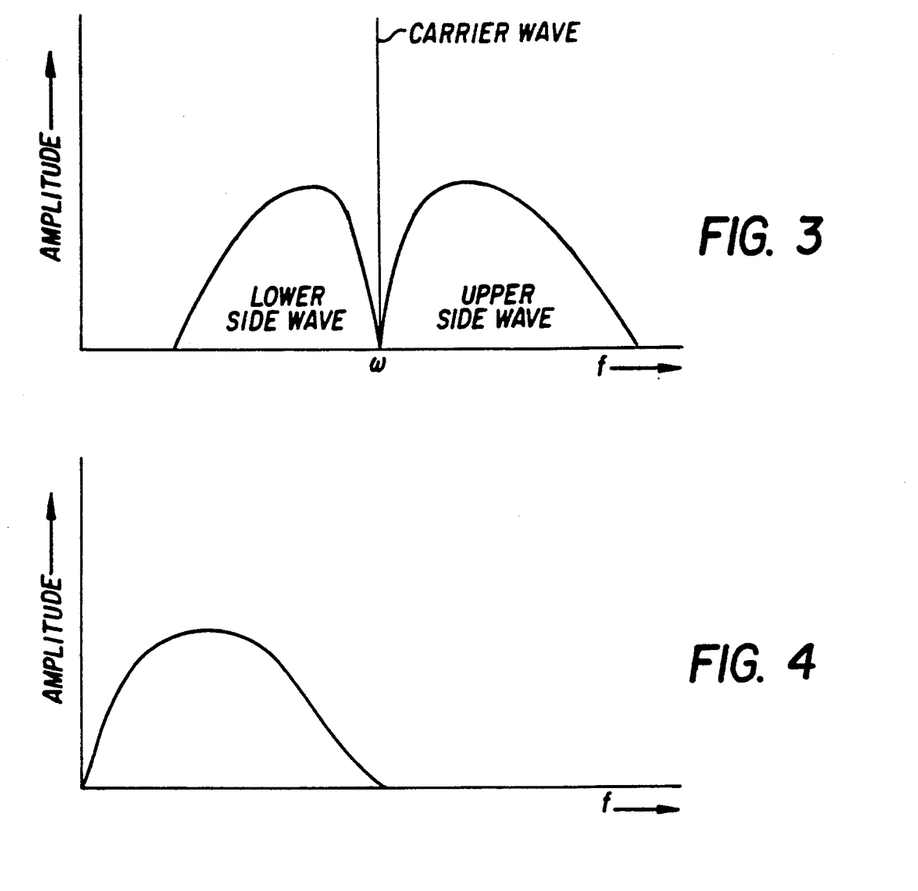
FIG. 3 is a view showing a spectrum of a modulated signal without pulse noise.
FIG. 4 is a view showing a spectrum of a demodulate signal without pulse noise.

FIG. 3 is a view showing a spectrum of the modulated signal without pulse noise. The figure shows one illustrating equation (2).

FIG. 4 is a view showing a spectrum of the demodulated signal without pulse noise. The figure shows the demodulation of the spectrum of the modulated signal and corresponds to $V_m(t)$ of equation (1).

Figure 5:
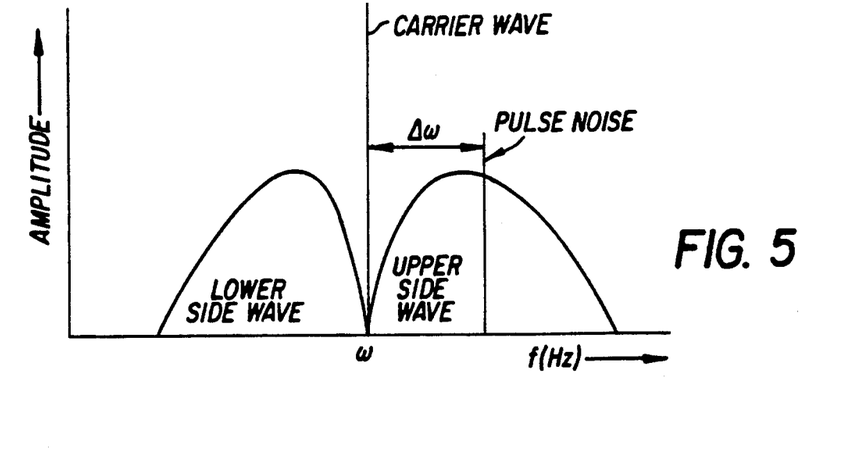
FIG. 5 is a view showing a spectrum of a modulated signal with pulse noise.

FIG. 5 is a view showing a spectrum of the modulated signal with pulse noise. As shown in the figure, the upper side wave and the lower side wave are at symmetrical positions in relation to the carrier wave, but the pulse noise is at an asymmetrical position with respect to the ordinary carrier wave and almost not never comes to a symmetrical position.

Here, setting the signal $V_E(t)$ of the pulse noise as $$V_E(t) = K_E \cos\{(\omega + \Delta\omega)t + \phi_O\} \quad (3)$$

an amplitude modulated signal $V_{AME}(t)$ is indicated by $$V_{AME}(t) = V_{AM}(t) + V_E \quad (4)$$

$$= (A - A_E)\cos(\omega t + \phi_o) + \quad \text{(carrier wave)}$$

$$\tfrac{1}{2}A \sum_{n=1}^{\infty} A_n \cos\{(\omega + np)t + \phi_n + \phi_o\} + \quad \text{(upper side wave)}$$

$$\tfrac{1}{2}A \sum_{n=1}^{\infty} A_n \cos\{(\omega t - np)t + \phi_n - \phi_o\} + \quad \text{(lower side wave)}$$

$$K_E[\cos(\omega t + \phi_o) + \cos\{(\omega + \Delta\omega)t + \phi_o)\}]. \quad \text{(pulse noise signal)}$$

Here, setting a modulated wave $\Delta V_E$ of the pulse noise signal as follows;

$$\Delta V_E = A_E[\cos(\omega t + \phi_o) + \cos\{(\omega + \Delta\omega)t + \phi_o\}] \quad (5)$$

$$= 2A_E \cos\{(2\omega + \Delta\omega)t + 2\phi_o\} \cdot \cos(\Delta\omega t).$$

Figures 6A, 6B:
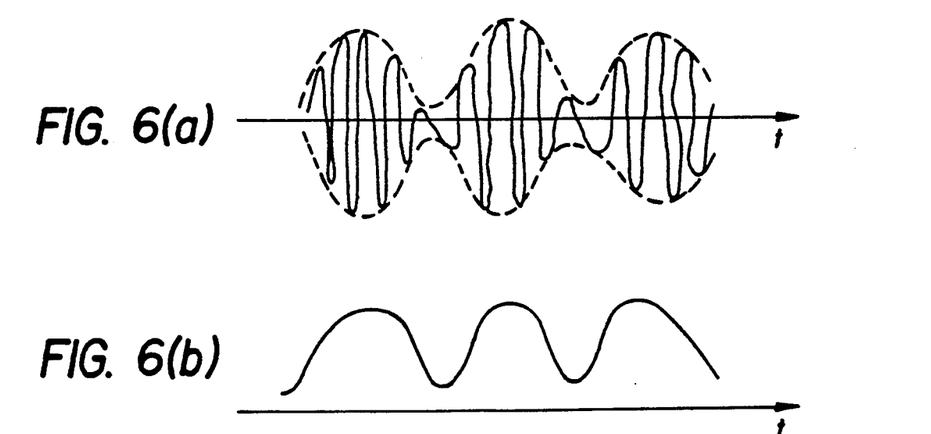
FIG. 6 is a view showing a portion of a modulated and demodulated signal not affected by pulse noise based on equation 4.

FIG. 6 is a view showing a portion of the modulated and demodulated signal not affected by the pulse noise of equation (4). In (a) of the figure, there are modulated signals including the carrier wave, the upper side wave, and the lower side wave. (b) of the figure shows a signal demodulated by the envelope detecting portion 108. These demodulated tected signals are input to the high pass filter 31.

Figure 7A:
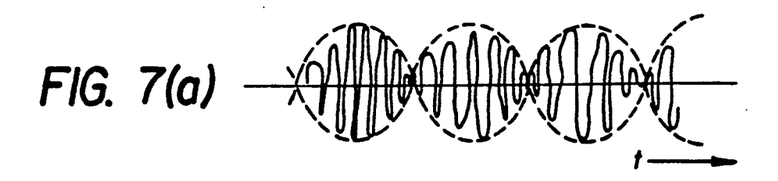
FIG. 7 is a view showing a portion $\Delta V_E$ of a modulated and demodulated signal affected by pulse noise of equation 4.
Figure 7B:
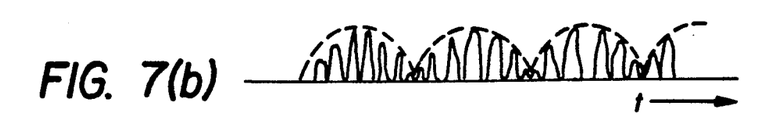
Figure 7C:
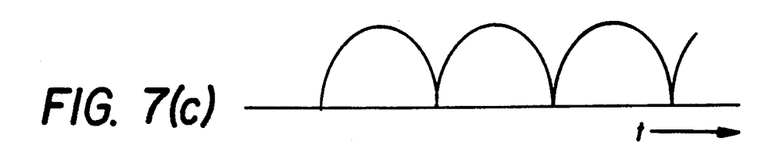

FIG. 7 is a view showing a portion $\Delta V_E$ of the modulated and demodulated signals affected by the pulse noise of equation (4). (a) of the figure shows the modulated signal $\Delta V_E$ of the pulse noise of equation (5), (b) of the figure shows rectification by the diode 1081 of the envelope detecting portion 108, and (c) of the figure shows envelope extraction attained by the resistor 1082 and the capacitor 1083.

These demodulated signals are input to the high pass filter 31.

Here, comparing the demodulated signals detected by the envelope detection in FIG. 6(b) and FIG. 7(c), the waveform shown in FIG. 6(b) changes continuously, while the waveform shown in FIG. 7(c) changes discontinuously in a point where the waveform turns from descent to ascent This difference arises in that, in FIG. 6(b), the modulated signal causes two side waves symmetrical in relation to the carrier frequency, while in FIG. 7(b) the pulse noise occurs at the asymmetrical position in relation to the carrier wave frequency.

Figure 8:
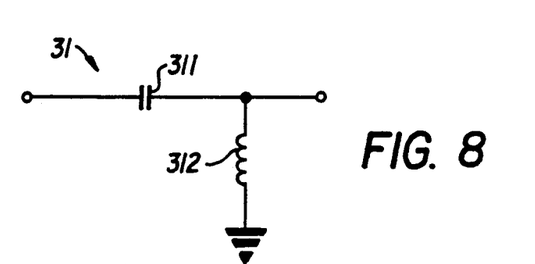
FIG. 8 is a view showing a high pass filter of a pulse noise detecting portion of FIG. 2.

Next, the operation of the pulse noise detecting portion 3 will be discussed. FIG. 8 is a view showing the high pass filter 31 of the pulse noise detecting portion of FIG. 1. The high pass filter 31 includes a capacitor 311 and a coil 312, as is illustrated.

Figure 9:
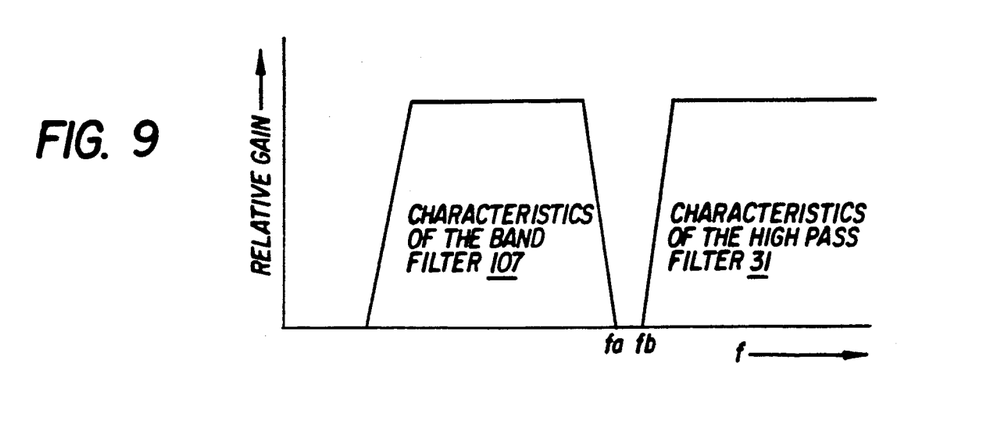
FIG. 9 is a view showing a relationship of a cut-off frequency between a band filter of a tuner and a high pass filter of a pulse noise detecting portion.

FIG. 9 is a view showing a relationship of the cut-off frequency characteristics between the band filter of the tuner and the pulse noise detecting portion. As shown in figure, the capacitance of the capacitor 311 and the inductance of the coil 312 in the high pass filter 31 are determined so that the cut-off frequency $f_b$ of the high pass filter 31 is larger than upper limit cut-off frequency $f_a$ of the band filter 107.

FIG. 10 is a view showing a waveform of the output of a pulse noise detecting portion when pulse noise occurs.

Figure 10A:
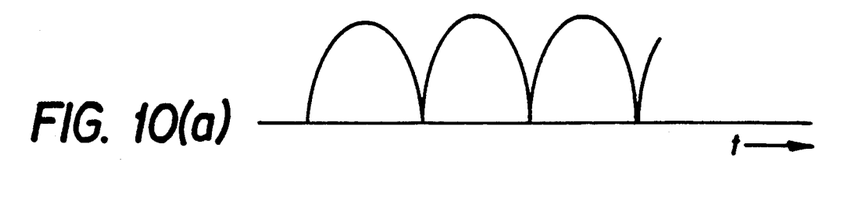
FIG. 10 is a view showing a waveform of an output of a pulse noise detecting portion when a pulse noise occurs.
Figure 10B:
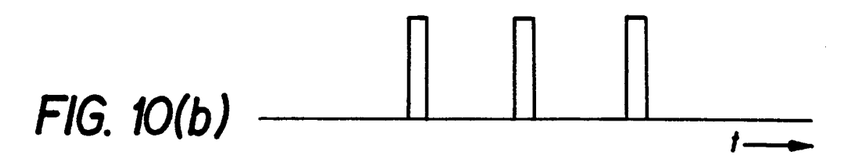

First, an envelope detection signal having no pulse noise or the portion of the envelope detection signal having pulse noise but not being affected by it is blocked by the high pass filter 31 so that there is no output of the pulse noise detecting portion. On the other hand, as shown in (a) of the figure, since the envelope detection signal affected by the pulse noise includes a higher harmonic wave signal for the pulse noise at discontinuous points, this higher harmonic wave signal passes through the high pass filter 31, is amplified by the amplifier 32, and is shaped by the level detecting portion 33, and is formed into the gate signal as shown in (b) of the figure.

Figure 11:
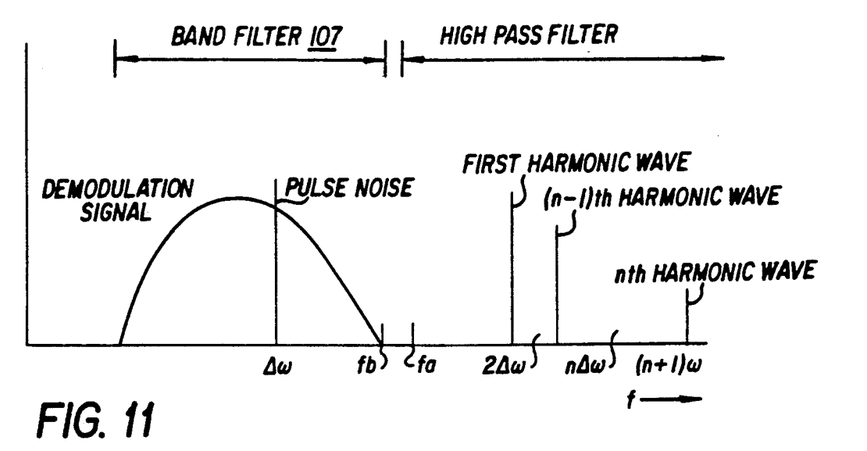
FIG. 11 is a view showing spectra of modulated and demodulated signals.

Next, the higher harmonic wave signal will be discussed. FIG. 11 is a view showing a spectrum of the demodulation signal and the pulse noise signal. As shown in the figure, the modulated signal passing through the band filter 107 and the higher harmonic wave of the pulse noise formed by the envelope detecting portion 108 pass through the high pass filter 31.

According to this embodiment, since the envelope detecting portion from the prior art is removed and the envelope detecting portion in the tuner is shared, no detection distortion occurs in the pulse noise detecting circuit 3 and the freedom of the design arrangement is increased.

Next a modification of the high pass filter 31 will be discussed.

If a frequency of a nearby broadcast station is mixed in, this is deemed as a pulse noise. The pulse noise detecting portion 3 detects and removes this, but this is not desirable since the object is to remove the pulse noise due to the ignition noise etc. of a vehicle. The frequency interval of such a nearby broadcast station is 9 KHz in Japan and 10 KHz in the U.S. If the level of the adjacent frequency is appreciably large, since cut-off characteristic of the band filter 107 of the intermediate frequency amplification stage of the tuner is limited, it is mixed in.

Figure 12:
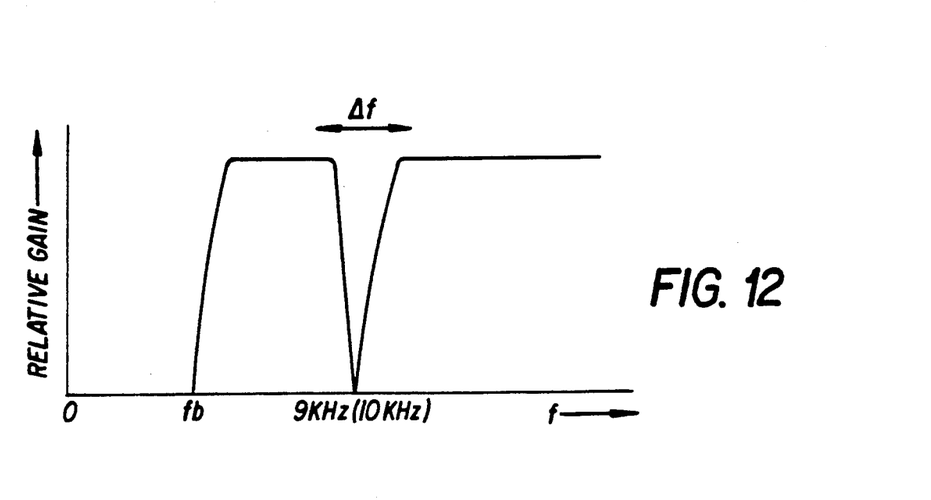
FIG. 12 is a view illustrating a trap of an adjacent interference frequency.

FIG. 12 explains a trap of an adjacent interference frequency. As shown in the figure if a trap $\Delta f$ for an adjacent interference frequency is provided at a frequency position 9 KHz (10 KHz) away from the adjacent interference frequency, the above-mentioned problem is solved.

FIG. 13 is a view showing a high pass/band elimination filter for trapping the adjacent interference frequency.

Figure 13A:
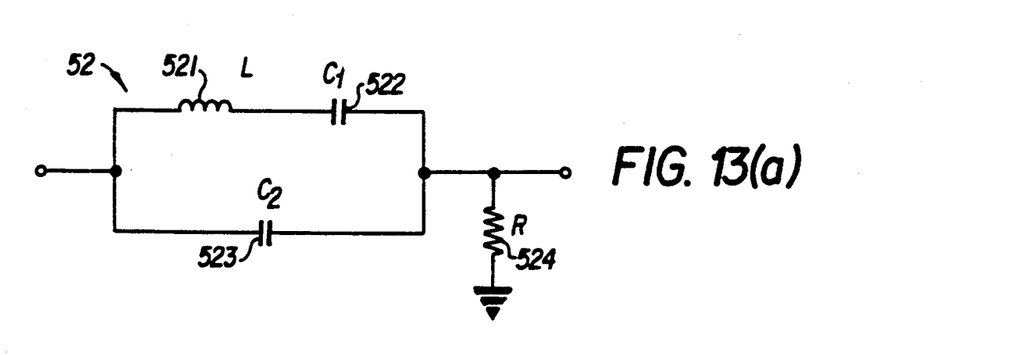
FIG. 13 is a view showing a high pass/band elimination filter for trapping an adjacent interference frequency.

As shown in (a) of the figure, the high pass/band elimination filter 52 includes a coil 521 with the inductance L and a capacitor 522 with the capacitance C1 connected in series, a capacitor 523 with the capacitance C2 connected in parallel therewith, and a resistor 524 of a resistance R grounded at the output side.

Figure 13B:
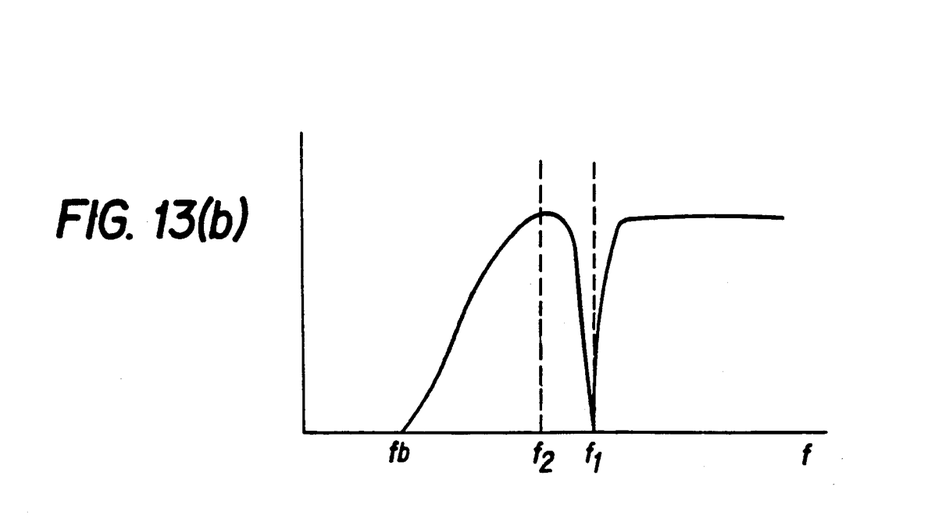

The characteristics of this high pass/band elimination filter 52, as shown in (b) of the figure, can form a trap at a frequency $f_1$, $$f_1 = \frac{1}{2\pi \sqrt{L\, C_m}}$$

where, $$C_m = C_1 C_2/(C_1 + C_2),$$

$$f_1 = \frac{1}{2\pi \sqrt{L\, C_1}}.$$

Therefore, in stead of the high pass filter 31, the high pass/band filter 52 may be used and the inductance L, and the capacitances C1 and C2 of the coil 521, capacipor 522 and 523 are adjusted respectively to form the trap of FIG. 12

Next, the operation of the system of the band filter 34 etc. will be discussed. First, as mentioned above, as the fundamental principle, even if a broadcast wave is detected by the envelope detecting portion, detection distortion does not occur, but detecition distortion often occurs depending on the characteristics of the AM receiver. The main reason is that due to the asymmetry of the upper and lower frequency characteristics of the intermediate frequency stage band filter 107, a level unbalance of an upper side wave and a lower side wave occurs and, for the same reason as mentioned above, the envelope detecting portion 108 has output distortion. This phenomena easily occurs the higher the modulation frequency. Therefore, the pulse noise detecting circuit 3 easily errs in detection if the modulation degree is high.

Figure 14:
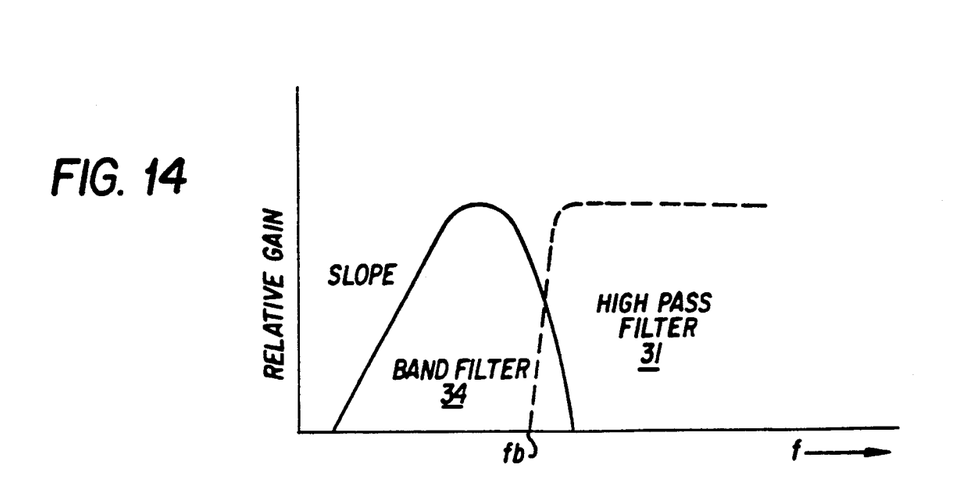
FIG. 14 is a view showing characteristics of a band filter of a pulse noise detecting circuit.

FIG. 14 is a view showing the characteristics of the band filter in the pulse noise detecting circuit.

As shown in the figure, the band filter 34 has the same frequency range as that of a detected broadcast wave, but the relative gain is asymmetrical in the high high/-low frequency range and has a slope at the low frequency portion as illustrated.

Therefore, in the level detecting portion 35, even if a signal with the same level is input to the band filter 34, if the frequency is higher, a signal with a high level is formed, and if the frequency is lower, a signal with a low level is formed. This is averaged by the low pass filter 36 to adjust the amplification gain of the amplifier 32. Here, the low pass filter 36 removes signals having the frequency of the pulse noise to prevent the system of the band filter 34 etc. from operating due to the pulse noise. If it operates, the achievement of the original object is obstructed.

In this way, if the modulation frequency is high on the average, it is possible to lower the detection sensitivity of the pulse noise detecting circuit 3.

Note, the band filter 34 has a slope at the high side. A similar amplification action of the amplifier 32 is obtained even if the above is reversed.

Finally, the signal delay circuit 201 shown in FIG. 1 uses a high order low pass filter etc., adjusts signal timing between the tuner 1 and the pulse noise detecting circuit 3 mentioned above, and synchronizes with the pulse noise removal portion 2.

As set forth above, according to the present invention, the envelope detection of the tuner is used to detect pulse noise and, further, the interference by the adjacent broadcast station and the detection distortion accompanying the asymmetry of the intermediate frequency stage band filter in the tuner are considered to improve freedom in design of the AM receiver and improve the ability to prevent erroneous operartion.

Figure 15:
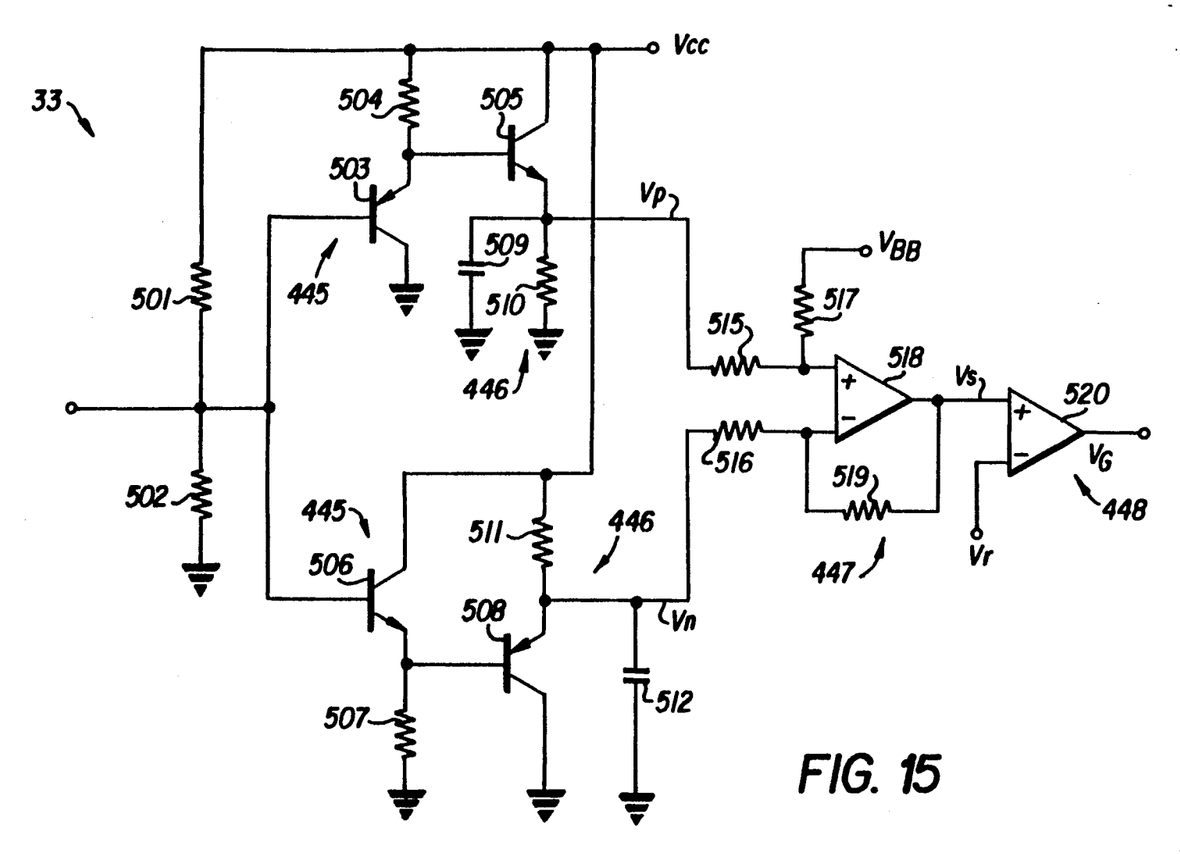
FIG. 15 is a view showing an example of a level detecting poriton of a pulse noise detecting apparatus in an AM receiver of an embodiment of the present invention.

FIG. 15 is a view showing an example of the level detecting portion of the pulse noise detecting circuit of the AM receiver according to an embodiment of the present invention.

The construction of the level detecting portion 33 of the figure will be discussed. The level detecting portion 33 if the figure comprises a resistor 501 connected at one side to the output of the amplifier 32 and connected at the other side to a voltage source Vcc, a resistor 502 connected at one side to the output of the amplifier 32 and grounded at the other side, a pnp type transistor 503 connected at the base to the output of the amplifier 32 and grounded at the collector, a resistor 504 connected at one side to the emitter of the transistor 503 and connected at the base to the voltage source Vcc, a npn type transistor 505 connected at the base to the emitter of the transistor 503 and connected at the collector to the voltage source Vcc, a npn type transistor 506 connected at the base to the output of the amplifier 32 and connected at the collector to the voltage source Vcc, a resistor 507 connected at one side to the emitter of the transistor 506 and grounded at the other side, a pnp type transistor 508 connected at the base to the emitter of the transistor 506 and grounded at the collector, a resistor 509 connected at one side to the emitter of the transistor 505 and grounded at the other side, and a resistor 510 connected in parallel to the capacitor 509, a resistor 511 connected at one side end to the emitter of the transistor 508 and connected at the other end to the voltage source Vcc, and a capacitor 512 connected at one side to the emitter of the transistor 508 and grounded at the other side; a resistor 515 connected at one side to the emitter of the transistor 505, a resistor 516 connected at one side to the emitter of the transistor 508, a resistor 517 connected at one side to the other side of the resistor 515 and connected at the other side to a voltage source VBB, a differential amplifier 518 connected at non-inversion terminal to the other side of the resistor 515 and connected at a inversion terminal to the other side of the resistor 516, a resistor 519 connected at one side to the output of the differential amplifier 518 and connected at the other side to the inversion terminal thereof to provide feedback; and a comparator 520 connected at the non-inversion terminal to the output of the differential amplifier, supplied at an inversion terminal with the reference voltage, outputting the gate signal to the pulse noise removal portion 2.

The resistors 501 to 510 constitute the positive and negative discriminating portion 445, the capacitors 509 to 512 constitute a holding and reducing portion 446, and the comparator 520 etc. constitute the comparating portion 448.

Figure 16A:
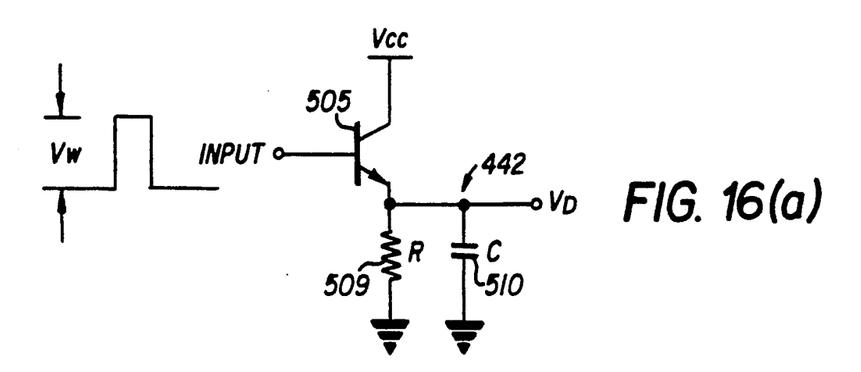
FIG. 16 is a view explaining a possible gate width for a pulse wave height.
Figure 16B:
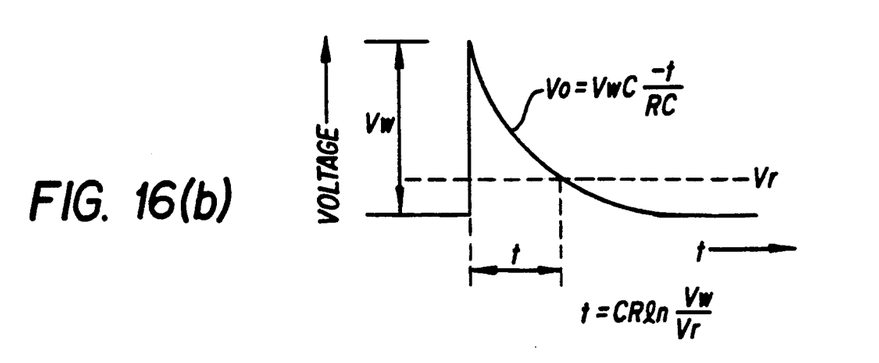

FIG. 16 is a view explaining a gate width variable in relation to a pulse wave height. (a) in the figure is a partial view of FIG. 15. If a signal with a wave height $V_M$ is input to the transistor 505, the capacitor 510 with a capacitance C is charged up to the wave height $V_M$ temporarily. when the input stops, it is discharged with a time constant RC through the resistor 509 with resistance R. (b) of the figure shows a change of the voltage $V_O$ across the capacitor 510 and shows that the time until $V_O$ becomes a reference voltage $V_r$ of the comparator 520, becomes the gate width.

Next, the series of operations of this embodiment will be discussed. FIG. 17 shows a signal waveform for illustrating the operation of an embodiment of the present invention. (a) and (b) of the figure are the same signal waveforms for corresponding to FIG. 21(a) and (b), (c) of the figure shows a signal waveform $V_P$ of the emitter of the transistor 505, (d) of the figure shows a signal waveform $V_n$ of the emitter of the transistor 508, (e) of the figure shows an output signal waveform $V_S$ of the differential amplifier 518, and (f) of the figure shows an output signal waveform of the comparator 520.

Figure 17A:
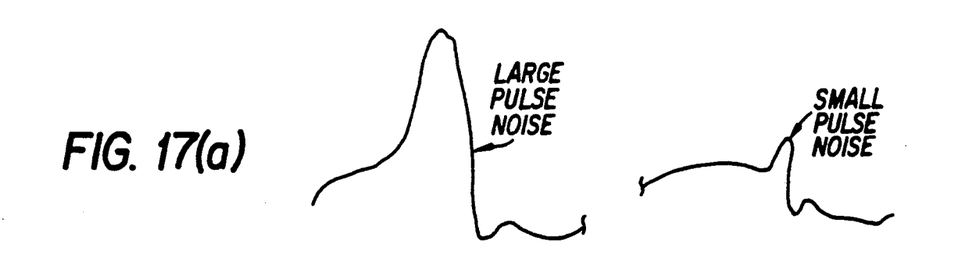
FIG. 17 is a view showing a signal waveform for explaining operation of an embodiment of the present invention.
Figure 17B:
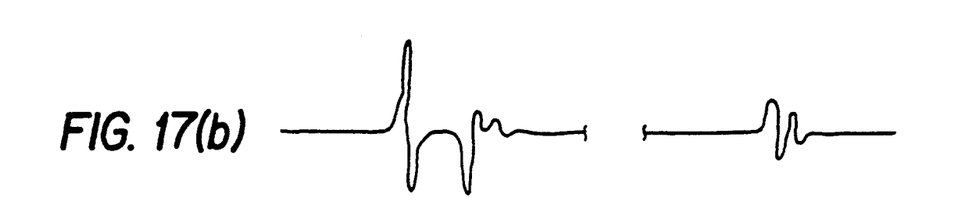
Figure 17C:
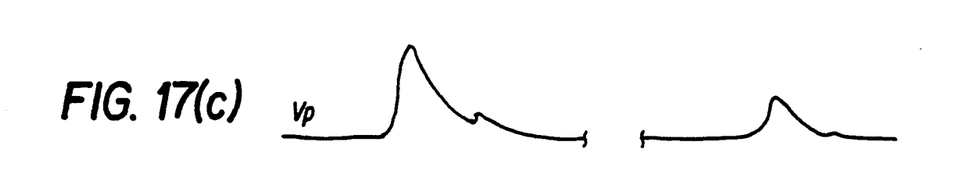
Figure 17D:
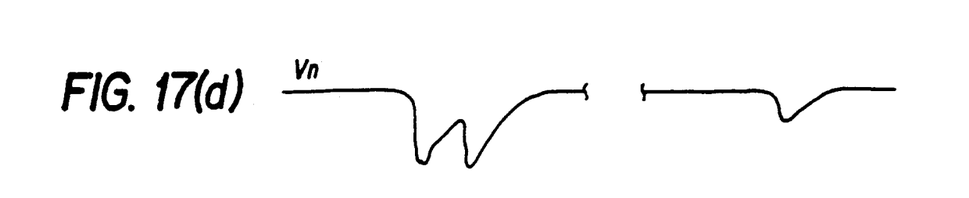

In the formation of the signal waveform $V_p$ and $V_n$, sets of two transistors are connected, such as the pnp type transistor 503 and npn type transistor 505 and the npn type transistor 506 and the pnp type transistor 511, DC biases are made the same, and thereby deviation is prevented at times of no input.

Figure 17E:
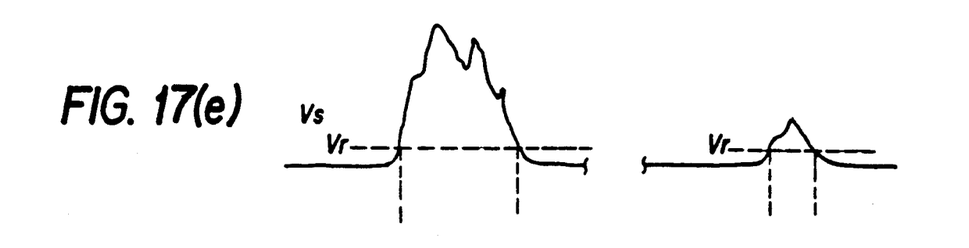
Figure 17F:
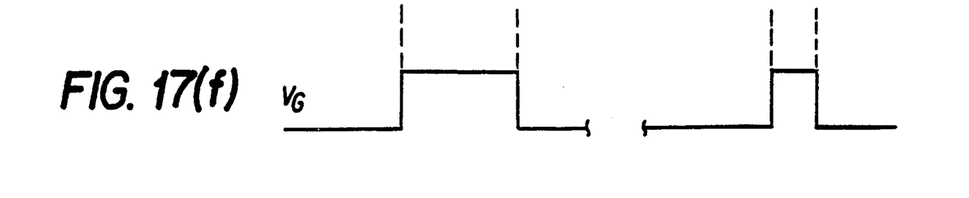

The output signal waveform $V_s$ indicated of (e) of the figure by $V_s = V_p - V_n$, its width is broader depending on the waveform of pulse noise, and the width of the gate pulse $V_G$ is broader through the comparator 520.

According to the construction as mentioned above, compared with the prior art, it is possible to reduce the number of the comparators or the amplifiers to one. Further according to this embodiment the level detecting portion of the pulse noise detecting circuit of the AM receiver changes the width of the gate signal to be broad or narrow depending on the input wave height of the high pass filter, so it is possible to restrain the waveform distortion.

We claim;

1. A pulse noise detecting system of an AM receiver having an envelope detecting circuit performing envelope detection of an intermediate frequency signal passing through a first band filter, the system further having a pulse noise removal circuit removing a pulse noise signal from an output signal of the envelope detecting circuit, the system provided with a pulse noise detecting circuit detecting the pulse noise signal and producing a gate signal to remove the pulse noise signal detected by the pulse noise removal circuit, the pulse noise detecting circuit comprising:
   a high pass filter blocking an envelope detection signal from the envelope detecting circuit and extracting the pulse noise signal;
   an amplifier amplifying the pulse noise signal extracted by the high pass filer;
   a first level detecting circuit detecting a level of the pulse noise signal amplified by the amplifier and producing the gate signal, the gate signal output to said pulse noise removal circuit when the pulse noise signal attains a first predetermined reference level; and p1 the pulse noise detecting circuit further having a second band filter extracting the envelope detection signal of the envelope detecting circuit, a gain of the amplifier is adjusted in response to a level of the envelope detection signal extracted by the second band filter, the level of the envelope detection signal being detected by a second level detection circuit connected to an output of the second band filter and smoothed by a low pass filter connected to an output of the second level detection circuit, an output of the low pass filter connected to the amplifier to maintain the pulse noise signal at a constant level.

2. The pulse noise detecting system of claim 1, wherein said high pass filter has a larger cut-off frequency than an upper limit cut-off frequency of the first band filter through which said intermediate frequency signal passes.

3. The pulse noise detecting system of claim 1, wherein said high pass filter has a larger cut-off frequency than an upper limit cut-off frequency of the first band filter through which said intermediate frequency signal passes, the high pass filter eliminating a frequency band of an adjacent broadcast.

4. The pulse noise detecting system of claim 2, wherein the gate signal produced by the pulse noise detecting circuit is blocked from the pulse noise removal circuit when a modulation frequency of said envelope detecting circuit is high.

5. The pulse noise detecting system of claim 2, further including a signal delay circuit connected between said envelope detecting circuit and said pulse noise removal circuit, the signal delay circuit adjusting timing of said gate signal by synchronizing timing with the pulse noise removal circuit.

6. The pulse noise detecting system of claim 1, wherein said second band filter has the same frequency range as said first band filter and has a slope of a relative gain at a lower frequency side.

7. The pulse noise detecting system of claim 1, wherein said level detecting circuit comprises:
 a discriminating circuit discriminating between a positive output signal and a negative output signal of said high pass filter;
 a holding and reducing circuit holding the positive output signal and the negative output signal of said high pass filter discriminated by said discriminating circuit and reducing the positive output signal and the negative output signal of said high pass filter discriminated by said discriminating circuit with a time constant;
 a subtracting circuit subtracting the negative output signal from the positive output signal of said holding and reducing circuit; and
 a comparing circuit outputting the gate signal to said pulse noise removal circuit when an output signal of said subtracting circuit exceeds the first predetermined reference value.

* * * * *